United States Patent
Xing (10) Patent No.: US 8,320,136 B2
(45) Date of Patent: Nov. 27, 2012

(54) STACKABLE ELECTRONIC COMPONENT

(75) Inventor: Kun Xing, Cary, NC (US)

(73) Assignee: Intersil Americas Inc., Milpitas, CA (US)

( * ) Notice: Subject to any disclaimer, the term of this patent is extended or adjusted under 35 U.S.C. 154(b) by 666 days.

(21) Appl. No.: 12/202,985

(22) Filed: Sep. 2, 2008

(65) Prior Publication Data

US 2009/0059546 A1 Mar. 5, 2009

Related U.S. Application Data (60) Provisional application No. 60/967,151, filed on Aug. 31, 2007.

(51) Int. Cl.
*H05K 7/00* (2006.01)
(52) U.S. Cl. ........ 361/782; 361/760; 174/526; 174/548; 336/82; 336/83; 336/200; 336/205
(58) Field of Classification Search ............ 336/82, 336/83, 65–67, 200, 205, 232, 223, 212, 336/180; 361/760, 772, 782, 696, 697, 701–714; 174/526, 548

See application file for complete search history.

(56) References Cited

U.S. PATENT DOCUMENTS

| | | | |
|---|---|---|---|
| 4,000,509 A * | 12/1976 | Jarvela | 257/697 |
| 4,088,942 A | 5/1978 | Miko | |
| 4,631,471 A | 12/1986 | Fouad et al. | |
| 4,710,798 A * | 12/1987 | Marcantonio | 257/777 |
| 5,204,809 A | 4/1993 | Andresen | |
| 5,414,401 A | 5/1995 | Roshen et al. | |
| 5,631,822 A | 5/1997 | Silberkleit et al. | |
| 5,764,500 A | 6/1998 | Matos | |
| 5,790,005 A | 8/1998 | Santi et al. | |
| 5,889,373 A | 3/1999 | Fisher et al. | |
| 5,929,692 A | 7/1999 | Carsten | |
| 5,982,160 A | 11/1999 | Walters et al. | |
| 6,018,468 A | 1/2000 | Archer et al. | |
| 6,144,194 A | 11/2000 | Varga | |
| 6,239,510 B1 | 5/2001 | Azimi et al. | |
| 6,272,023 B1 | 8/2001 | Wittenbreder | |
| 6,278,263 B1 | 8/2001 | Walters et al. | |
| 6,362,986 B1 | 3/2002 | Schultz et al. | |

(Continued)

FOREIGN PATENT DOCUMENTS

JP 56023725 3/1981

(Continued)

OTHER PUBLICATIONS

Xiao et al. (2009) "Parasitic Resistance Current Sensing Topology for Coupled Inductors" pp. 14.

(Continued)

Primary Examiner — Hoa C Nguyen
(74) Attorney, Agent, or Firm — Graybeal Jackson LLP (57) ABSTRACT

An embodiment of an electronic component includes a circuit element disposed within a package, which includes a surface and at least one standoff protruding from the surface. For example, where the circuit element is an inductor in a power supply, the standoff may allow one to mount the inductor component over another component, such as a transistor component. Therefore, the layout area of such a power supply may be smaller than the layout area of a power supply in which the inductor and transistor components are mounted side by side.

18 Claims, 7 Drawing Sheets

U.S. PATENT DOCUMENTS

| | | |
|---|---|---|
| 6,417,753 B1 | 7/2002 | Wolf et al. |
| 6,549,436 B1 | 4/2003 | Sun |
| 6,686,727 B2 | 2/2004 | Ledenev et al. |
| 6,696,823 B2 | 2/2004 | Ledenev et al. |
| 6,765,468 B2 | 7/2004 | Chen et al. |
| 6,822,875 B2* | 11/2004 | Chan et al. ............... 361/760 |
| 6,856,230 B2 | 2/2005 | Lu |
| 6,873,237 B2 | 3/2005 | Chandrasekaran et al. |
| 6,885,274 B2 | 4/2005 | Hsu et al. |
| 6,980,077 B1 | 12/2005 | Chandrasekaran et al. |
| 6,995,548 B2 | 2/2006 | Walters et al. |
| 7,002,325 B2 | 2/2006 | Harris et al. |
| 7,005,835 B2 | 2/2006 | Brooks et al. |
| 7,026,798 B2 | 4/2006 | Cheung et al. |
| 7,046,523 B2 | 5/2006 | Sun et al. |
| 7,109,691 B2 | 9/2006 | Brooks et al. |
| 7,136,293 B2 | 11/2006 | Petkov et al. |
| 7,233,132 B1 | 6/2007 | Dong et al. |
| 7,242,172 B2 | 7/2007 | Carlson et al. |
| 7,301,314 B2 | 11/2007 | Schuellein et al. |
| 7,327,128 B2 | 2/2008 | Dinh |
| 7,352,269 B2 | 4/2008 | Li et al. |
| 7,358,710 B2 | 4/2008 | Luo et al. |
| 7,365,518 B2 | 4/2008 | Wiseman |
| 7,394,233 B1 | 7/2008 | Trayling et al. |
| 7,449,867 B2 | 11/2008 | Wu et al. |
| 7,456,618 B2 | 11/2008 | Jain et al. |
| 7,468,899 B1 | 12/2008 | Hopper et al. |
| 7,508,182 B1 | 3/2009 | Chang |
| 7,514,909 B2 | 4/2009 | Burstein et al. |
| 7,567,163 B2 | 7/2009 | Dadafshar et al. |
| 7,782,031 B2 | 8/2010 | Qiu et al. |
| 7,808,355 B2 | 10/2010 | Nagano et al. |
| 2003/0197585 A1 | 10/2003 | Chandrasekaran et al. |
| 2003/0198067 A1 | 10/2003 | Sun et al. |
| 2004/0051616 A1* | 3/2004 | Kiko et al. ............... 336/173 |
| 2004/0113741 A1 | 6/2004 | Li et al. |
| 2004/0140877 A1* | 7/2004 | Nakao et al. ............... 336/200 |
| 2004/0160298 A1 | 8/2004 | Hsu et al. |
| 2004/0178473 A1* | 9/2004 | Dentry et al. ............... 257/532 |
| 2004/0239470 A1 | 12/2004 | Lu |
| 2005/0024179 A1 | 2/2005 | Chandrasekaran et al. |
| 2005/0024838 A1* | 2/2005 | Maxwell ............... 361/782 |
| 2005/0151614 A1* | 7/2005 | Dadafshar ............... 336/223 |
| 2005/0174208 A1* | 8/2005 | Sato et al. ............... 336/200 |
| 2005/0286270 A1 | 12/2005 | Petkov et al. |
| 2006/0038549 A1 | 2/2006 | Mehrotra et al. |
| 2006/0038650 A1 | 2/2006 | Mehrotra et al. |
| 2006/0145800 A1 | 7/2006 | Dadafshar et al. |
| 2006/0187684 A1 | 8/2006 | Chandrasekaran et al. |
| 2006/0197510 A1 | 9/2006 | Chandrasekaran |
| 2006/0250205 A1* | 11/2006 | De et al. ............... 336/65 |
| 2007/0258213 A1* | 11/2007 | Chen et al. ............... 361/701 |
| 2007/0273349 A1 | 11/2007 | Wei et al. |
| 2007/0285200 A1* | 12/2007 | Hsieh ............... 336/83 |
| 2008/0067990 A1 | 3/2008 | Wei |
| 2008/0303495 A1 | 12/2008 | Wei et al. |
| 2008/0309299 A1 | 12/2008 | Wei et al. |
| 2008/0315982 A1 | 12/2008 | Wei et al. |
| 2009/0045785 A1 | 2/2009 | Xiao et al. |
| 2009/0108821 A1* | 4/2009 | Standing ............... 323/272 |

FOREIGN PATENT DOCUMENTS

| | | |
|---|---|---|
| WO | 2006/026674 | 3/2006 |

OTHER PUBLICATIONS

Czogalla (2003) "Automotive Application of Multi-Phase Coupled-Inductor DC-DC Converter" IAS Conference, Oct. 12-16, 3:1524-1529.

Dixon (1993) "Coupled Inductor Design", Unitrode Seminar, May 1993, Topic 8.

Finn (2004) "Applications and Equivalent Models for Coupled Inductor Parallel Interleaved Converters", AUPEC 2004, Brisbane, Australia, Sep. 26-29.

Li (2002) "Coupled-Inductor Design Optimization for Fast-Response Low-Voltage DC-DC Converters", IEEE APEC, Mar. 10-14, Dallas, Texas, 2:817-823.

Maksimovic (1998) "Modeling of Cross-Regulation in Converters Containing Coupled Inductors", IEEE APEC, Feb. 15-19, Anaheim, California, 1:350-356.

Park (1997) "Modeling and Analysis of Multi-Interphase Transformers for Connecting Power Converters in Parallel", IEEE PSEC, Jun. 22-27, St. Louis, Missouri, 2:1164-1170.

Wong (2000) "Investigating Coupling Inductors in the Interleaving QSW VRM", IEEE APEC, Feb. 6-10, New Orleans, Louisiana, 2:973-978.

Wu (2006) "Multi-Phase Buck Converter Design with Two-Phase Coupled Inductors", IEEE APEC, Mar. 19-23.

Xu (1996) "Analysis by Finite Element Method of a Coupled Inductor Circuit Used as Current Injection Interface", IEEE Workshop on Computers in Power Electronics, Aug. 11-14, Portland, Oregon.

Jieli Li, et al., "Using Coupled Inductors to Enhance Transient Performance of Multi-Phase Buck Converters", 2004 IEEE, pp. 1289-1293.

Anderson F. Hoke, et al., "An Improved Two-Dimensional Numerical Modeling Method for E-Core Transformers", Thayer School of Engineering.

* cited by examiner

STACKABLE ELECTRONIC COMPONENT

CLAIM OF PRIORITY

This application claims priority to U.S. Provisional Application Ser. No. 60/967,151 filed on Aug. 31, 2007, which is incorporated by reference.

SUMMARY

This Summary is provided to introduce, in a simplified form, a selection of concepts that are further described below in the Detailed Description. This Summary is not intended to identify key features or essential features of the claimed subject matter, nor is it intended to be used to limit the scope of the claimed subject matter.

An embodiment of an electronic component includes a package and a circuit element disposed within the package, which includes a surface and a standoff protruding from the surface.

For example, where the circuit element is an inductor in a power supply, the standoff may allow one to mount the inductor component over another component, such as a transistor component. Therefore, the layout area of such a power supply may be smaller than the layout area of a power supply in which the inductor and transistor components are mounted side by side.

DETAILED DESCRIPTION

Figure 1:
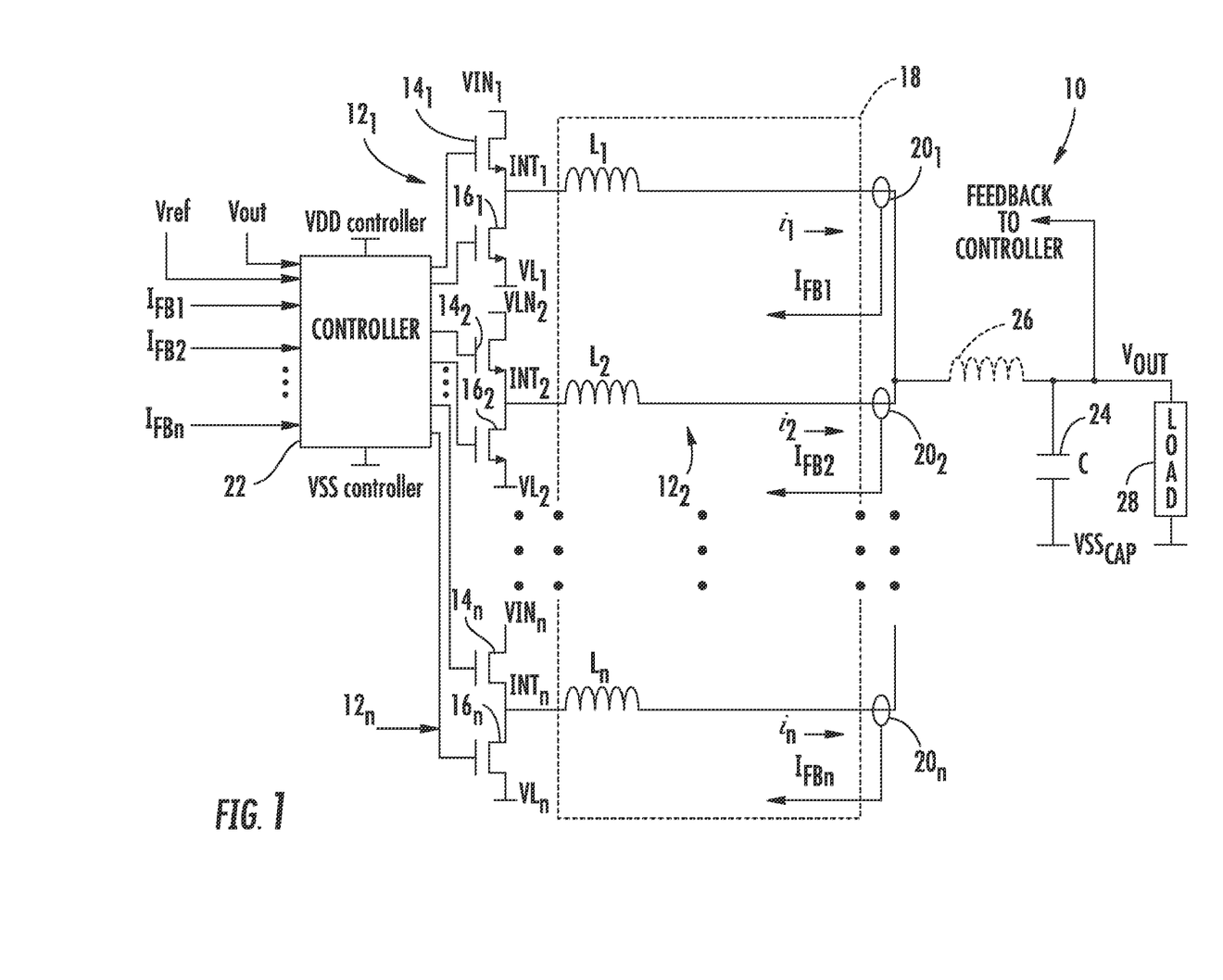
FIG. 1 is a schematic diagram of an embodiment of a power supply having one or more phases.

FIG. 1 is a schematic diagram of an embodiment of a power supply 10, here a buck converter, which provides a regulated output voltage $V_{out}$ and which includes one or more phase paths (alternatively "phases") $12_1$-$12_n$ each having a respective high-side drive transistor $14_1$-$14_n$, a respective low-side drive transistor $16_1$-$16_n$, and a respective inductor $L_1$-$L_n$. As discussed below in conjunction with FIGS. 3-7, the inductors $L_1$-$L_n$ may be part of an inductor component 18, which may be stackable over one or more other components such as components that include the transistors 14 and 16. Such stacking of components may reduce the area occupied by the power supply 10 as compared to prior power supplies in which the components are not stacked, but are instead laid out side by side.

In addition to the transistors 14 and 16 and the inductor component 18, the power supply 10 includes current sensors $20_1$-$20_n$, a power-supply controller 22, a filter capacitor 24, and an optional filter inductor 26. An inductor L and the high-side and low-side transistors 14 and 16 coupled to the inductor at a phase intermediate node INT compose a respective phase 12. For example, the inductor $L_1$ and the transistors $14_1$ and $16_1$ compose the phase $12_1$.

The high-side transistors $14_1$-$14_n$, which are each switched "on" and "off" by the controller 22, are power NMOS transistors that are respectively coupled between input voltages $VIN_1$-$VIN_n$ and the nodes $INT_1$-$INT_n$. Alternatively, the transistors $14_1$-$14_n$ may be other than power NMOS transistors, and may be coupled to a common input voltage. Moreover, the transistors $14_1$-$14_n$ may be integrated on the same die as the controller 22, may be integrated on a same die that is separate from the die on which the controller is integrated, or may be disposed on discrete transistor components as discussed below in conjunction with FIGS. 2A-7.

Similarly, the low-side transistors $16_1$-$16_n$, which are each switched on and off by the controller 22, are power NMOS transistors that are respectively coupled between low-side voltages $VL_1$-$VL_n$ and the nodes $INT_1$-$INT_n$ of the inductors $L_1$-$L_n$. Alternatively, the transistors $16_1$-$16_n$ may be other than power NMOS transistors, and may be coupled to a common low-side voltage such as ground. Moreover, the transistors $16_1$-$16_n$ may be integrated on the same die as the controller 22, may be integrated on a same die that is separate from the die on which the controller is integrated, may be integrated on a same die as the high-side transistors $16_1$-$16_n$, may be integrated on respective dies with the corresponding high-side transistors $16_1$-$16_n$ (e.g., transistors $14_1$ and $16_1$ on a first die, transistors $14_2$ and $16_2$ on a second die, and so on), or may be disposed on discrete transistor components as discussed below in conjunction with FIGS. 2A-7.

The inductors $L_1$-$L_n$ of the inductor component 18 may be magnetically coupled to one another, may be magnetically uncoupled from one another, or some of the inductors may be magnetically coupled and others of the inductors may be magnetically uncoupled. Power supplies incorporating magnetically coupled inductors, magnetically uncoupled inductors, or both magnetically coupled and magnetically uncoupled inductors, are discussed in the following U.S. Patent Applications, which are incorporated by reference: application Ser. No. 11/903,185 filed Sep. 19, 2007, Ser. Nos. 12/136,014, 12/136,018, 12/136,023 all filed Jun. 9, 2008, and Ser. No. 12/189,112 filed Aug. 8, 2008.

The current sensors $20_1$-$20_n$ respectively generate sense signals $I_{FB1}$-$I_{FBn}$, which respectively represent the phase currents $i_1$-$i_n$. For example, each of the signals $I_{FB1}$-$I_{FBn}$ may be a respective voltage that has substantially the same signal phase as the corresponding phase current i and that has an amplitude that is substantially proportional to the amplitude of the corresponding phase current.

The controller 22 may be any type of controller suitable for use in a power supply, is supplied by voltages $VDD_{controller}$ and $VSS_{controller}$, and receives the regulated output voltage $V_{out}$, a reference voltage $V_{ref}$ and the sense signals $I_{FB1}$-$I_{FBn}$, which are fed back to the controller from the current sensors $20_1$-$20_n$, respectively. The controller 22 may use $V_{ref}$ and the fed back $V_{out}$ and $I_{FB1}$-$I_{FBn}$ to conventionally regulate $V_{out}$ to a specified value.

The filter capacitor 24 is coupled between the regulated output voltage $V_{out}$ and a voltage $VSS_{cap}$, and works in concert with the inductors $L_1$-$L_n$ and the optional filter inductor 26 (if present) to maintain the amplitude of the steady-state ripple-voltage component of $V_{out}$ within a desired range, which may be on the order of hundreds of microvolts (µV) to tens of millivolts (mV). Although only one filter capacitor 24 is shown, the power supply 10 may include multiple filter capacitors coupled in electrical parallel. Furthermore, multiple serially coupled LC filter stages (each stage would be similar to the stage formed by the optional filter inductor 26 and the filter capacitor 24) may be disposed between $V_{out}$ and the inductors $L_1$-$L_n$, and the feedback to the controller 22 may be taken from $V_{out}$ (the output of the last filter stage) or from any one of the previous filter stages. Moreover, $VSS_{cap}$ may be equal to $VSS_{controller}$ and to $VL_1$-$VL_n$; for example, all of these voltages may equal ground.

The optional filter inductor 26 may be omitted from the power supply 10. For example, the filter inductor 26 may be omitted if the inductors $L_1$-$L_n$ are not magnetically coupled to one another, or if the inductors $L_1$-$L_n$ are magnetically coupled to one another and the respective leakage inductances of the inductors $L_1$-$L_n$ are sufficient to perform the specified inductive filtering function. Omitting the filter inductor 26 may reduce the size (e.g., the layout area) and component count of the power supply 10, and may eliminate a component through which the total supply current (i.e., $i_1 + i_2 + \ldots + i_n$) flows.

The power supply 10 may provide the regulated voltage $V_{out}$ to a load 28, such as a microprocessor or other electronic load.

Still referring to FIG. 1, alternate embodiments of the power supply 10 are contemplated. For example, although described as a single-phase or multiphase buck converter, the power supply 10 may be any other type of single-phase or multiphase power supply. Furthermore, the current sensors $20_1$-$20_n$ may be omitted.

Figure 2A:
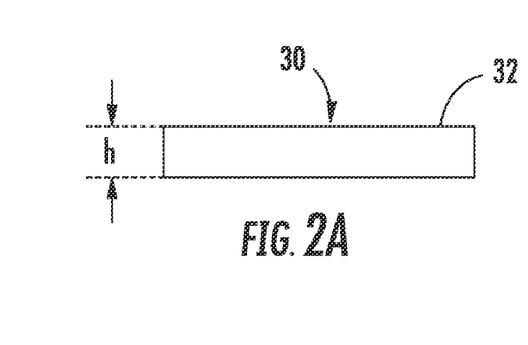
FIGS. 2A-2C are respective side, bottom, and schematic views of an embodiment of a transistor component that may be used in the power supply of FIG. 1.
Figure 2B:
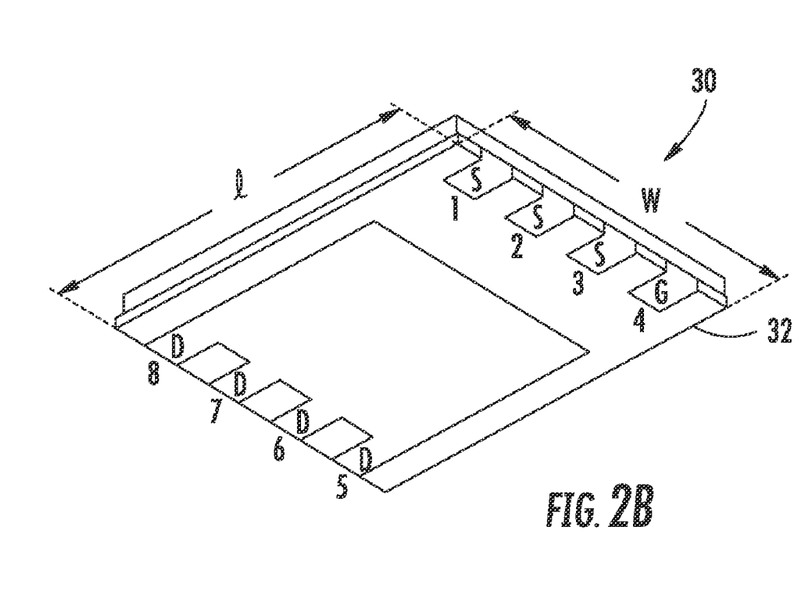
Figure 2C:
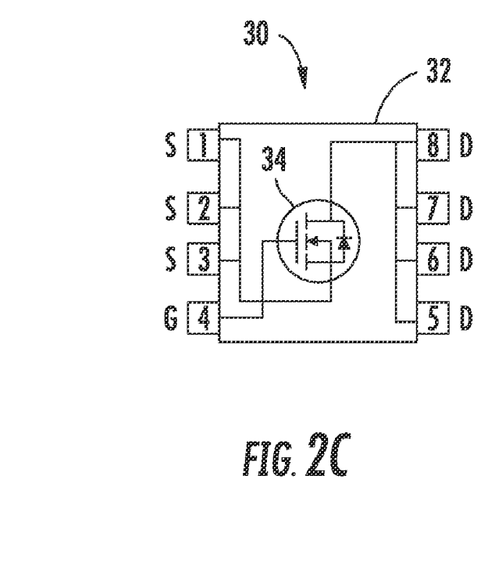

FIGS. 2A-2C are respective side, bottom, and schematic views of an embodiment of a transistor component 30, which includes a low-profile surface-mount package 32 and an NMOS transistor 34 such as one of the transistors $14_1$-$14_n$ and $16_1$-$16_n$ of FIG. 1. D, S, and G respectively indicate the drain, source, and gate leads of the transistor 34, and, in one embodiment, the package length l, width w, and height h have approximately the following respective values: 6.15 millimeters (mm), 5.15 mm, and 1.1 mm. As discussed below in conjunction with FIGS. 3-7, one or more transistor components like the transistor component 30 may be used to implement the transistors $14_1$-$14_n$ and $16_1$-$16_n$ in a physical implementation of the power supply 10 of FIG. 1.

Still referring to FIGS. 2A-2C, alternate embodiments of the transistor component 30 are contemplated. For example, although described as including one NMOS transistor 34, the component 30 may include multiple transistors, one or more transistors of different types (e.g., bipolar), or other electronic components such as one or more diodes.

Figure 3A:
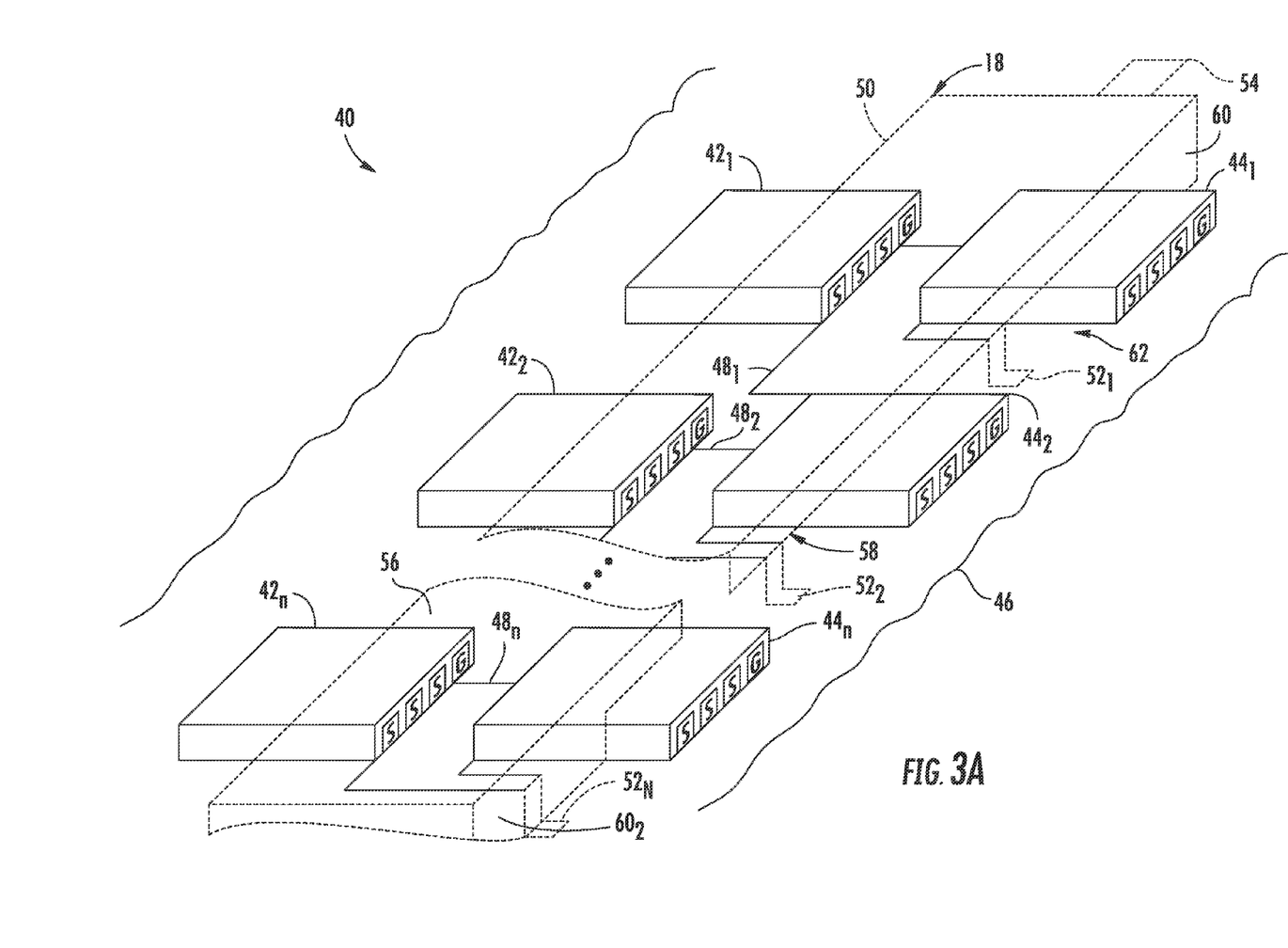
FIG. 3A is a perspective view of a portion of an embodiment of the power supply of FIG. 1, the portion including an inductor component stacked over transistor components that are similar to the transistor component of FIGS. 2A-2C.

FIG. 3A is a perspective view of a portion 40 of an embodiment of the power supply 10 of FIG. 1, in which the inductor component 18 is stacked over one or more transistor components to reduce the layout area occupied by the power supply.

Figure 3B:
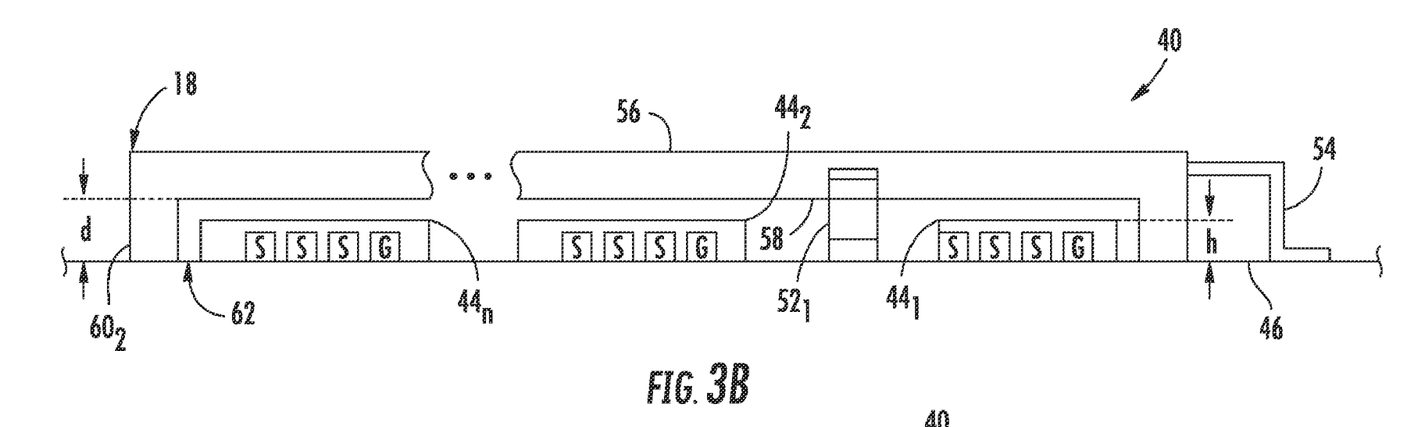
FIG. 3B is a side view of the power-supply portion of FIG. 3A.

FIG. 3B is a side view of the portion 40 of FIG. 3A.

Referring to FIGS. 3A and 3B, the power-supply portion 40 includes transistor components $42_1$-$42_n$ and $44_1$-$44_n$, the inductor component 18, and a circuit board 46 to which the components 18, 42, and 44 are mounted.

The transistor components $42_1$-$42_n$ respectively include the high-side drive transistors $14_1$-$14_n$ of FIG. 1, and the transistor components $44_1$-$44_n$ respectively include the low-side drive transistors $16_1$-$16_n$ of FIG. 1. The transistor components $42_1$-$42_n$ and $44_1$-$44_n$ may be similar to the transistor component 30 of FIGS. 2A-2C.

The corresponding leads of each high-side/low-side pair of transistor components 42 and 44 are coupled to a respective conductive trace 48 on the circuit board 46, where the conductive trace corresponds to a respective node INT of FIG. 1. For example, the source leads S of the transistor component $42_1$ and the drain leads D of the transistor component $44_1$ are soldered to the trace $48_1$ (corresponds to the node $INT_1$ of FIG. 1), the source leads S of the transistor component $42_2$ and the drain leads D of the transistor component $44_2$ are soldered to the trace $48_2$ (corresponds to the node $INT_2$ of FIG. 1), and so on. Alternatively, because of the direction of the phase currents $i_1$-$i_n$ when the low-side transistors $16_1$-$16_n$ are on, the source leads S of the low-side transistor components $44_1$-$44_n$ (instead of the drain leads D of the low-side transistor components) may be soldered to the respective traces $48_1$-$48_n$.

The inductor component 18 includes a package 50, which is shown in phantom dashed line, the inductors $L_1$-$L_n$, which are disposed inside of the package and which are omitted from FIGS. 3A-3B for clarity, and conductive leads $52_1$-$52_n$ and 54.

The package 50 includes an upper surface 56, which faces away from the circuit board 46, and a lower surface 58, which faces toward the circuit board. The package 50 may be formed from plastic, ceramic, or any other suitable material.

Protruding from the lower surface 56 are supports (hereinafter standoffs) $60_1$ and $60_2$, which together with the lower surface, form a recess 62, which receives, at least partially, the transistor components 42 and 44. That is, a depth d of the recess 62 is greater than or equal to the height h of the transistor components 42 and 44 so that the when the inductor component 18 is positioned over the transistor components 42 and 44, the standoffs $60_1$ and $60_2$ contact the circuit board 46, and thus support the inductor component over the transistor components. Therefore, the standoffs $60_1$ and $60_2$ allow one to stack the inductor component 18 and the transistor components 42 and 44.

Each of the leads $52_1$-$52_n$ is coupled to the drive node (the node respectively corresponding to the node $INT_1$-$INT_n$ of FIG. 1) of a respective inductor $L_1$-$L_n$, and is soldered to a respective trace $48_1$-$48_n$. The leads $52_1$-$52_n$ may also act as standoffs.

In contrast, the lead 54 is coupled to the output nodes of all of the inductors $L_1$-$L_n$, and is soldered to a circuit-board trace (not shown in FIGS. 3A and 3B) that is connected to the filter inductor 26 if the filter inductor is present or to the node providing $V_{out}$ if the filter inductor is omitted. Like the leads $52_1$-$52_n$, the lead 54 may also act as a standoff.

In an embodiment of the power-supply portion 40, the height of the inductor component 18 measured at its upper surface 56 may be less than or equal to about 4 mm, which may be low enough for many power-supply applications.

Still referring to FIGS. 3A-3B, alternate embodiments of the power-supply portion 40 and the inductor component 18 are contemplated. For example, although shown as covering only parts of the transistor components 42 and 44, the inductor component 18 may completely cover some or all of the transistor components, or may not cover any portion of some of the transistor components. Furthermore, although shown disposed at the ends of the package 50, the standoffs $60_1$ and $60_2$ may be disposed at other locations (e.g., the center) of the package. Moreover, although two standoffs $60_1$ and $60_2$ are shown, the package 50 may include more or fewer than two standoffs. In addition, the leads 52 and 54 may be disposed at locations of the package other than the illustrated locations.

For example, the leads $52_1$-$52_n$ may each protrude from the lower surface 58 over a respective one of the traces $48_1$-$48_n$. Furthermore, although the inductor component 18 is described as being stacked over the transistor components 42 and 44, the transistor components may be stacked over the inductor component 18 in a similar manner, or, in general, any first component may be stacked over any second component in a similar manner. Moreover, more than two components may be stacked over one another. In addition, the space between the lower surface 58 of the inductor-component package 50 and the circuit board 46 (and between the lower surface of the package and the transistor components 42 and 44 if d>h) may be partially or completely filled with a material such as epoxy or a thermally conductive material. Furthermore, although discussed as including inductors and transistors, respectively, the components 18, 42, and 44 may also include other circuit elements. Moreover, the dimensions of the inductor component 18 and the transistor components 42 and 44 may be different than disclosed.

Figure 4:
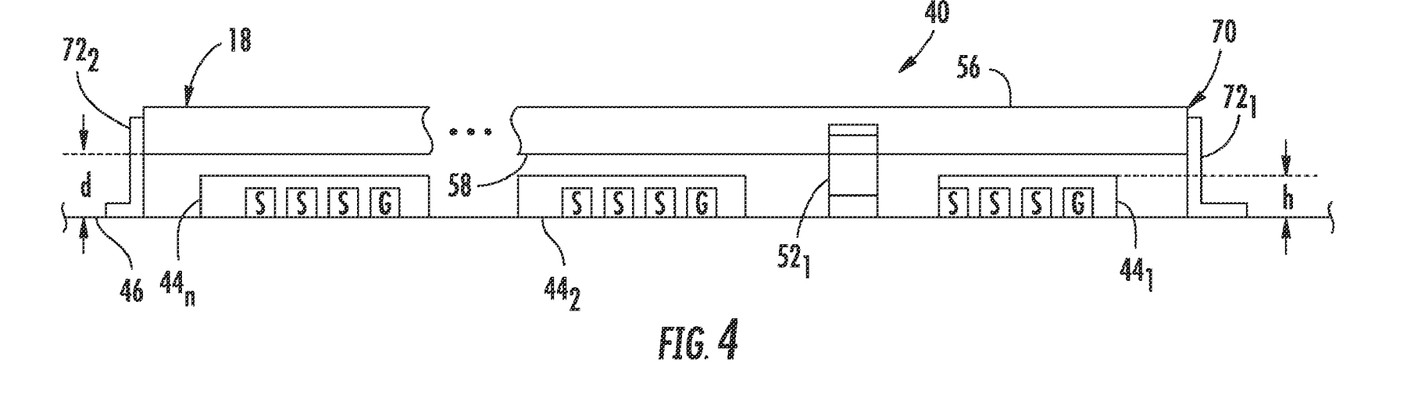
FIG. 4 is a side view of another embodiment of the power-supply portion of FIGS. 3A and 3B.

FIG. 4 is a side view of another embodiment of the power-supply portion 40 of FIGS. 3A and 3B including another embodiment of the inductor component 18. The inductor component 18 of FIG. 4 includes a package 70 and standoffs $72_1$ and $72_2$, and is similar to the inductor component 18 of FIGS. 3A and 3B except that unlike the standoffs $60_1$ and $60_2$, which are integral with the package 50, the standoffs $72_1$ and $72_2$, are attached to the package 70. For example, the standoffs $72_1$ and $72_2$ may be made of metal and attached the sides of the package 70, or they may be part of and extend from a lead frame (not shown in FIG. 4) internal to the package 70. Alternatively, the standoffs $72_1$ and $72_2$ may be conductive leads that are respectively coupled to the inductors $L_1$-$L_n$ or to other circuit elements within the package 70. For example, the output lead 54 (FIGS. 3A and 3B) may form the standoff $72_1$.

Alternate embodiments of the power-supply portion 40 and the inductor component 18 of FIG. 4 are contemplated. For example, the alternate embodiments discussed above in conjunction with FIGS. 3A and 3B are contemplated for the power-supply portion 40 and inductor component 18 of FIG. 4.

Figure 5:
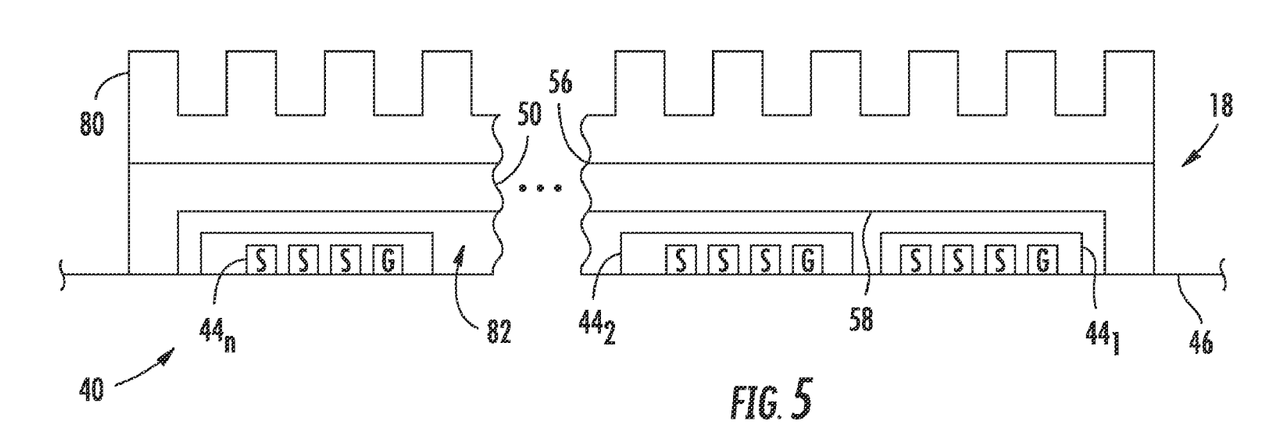
FIGS. 5 and 6 are side views of respective other embodiments of the power-supply portion of FIGS. 3A and 3B.

FIG. 5 is a side view of another embodiment of the power-supply portion 40 of FIG. 3A including another embodiment of the inductor component 18. The inductor component 18 of FIG. 5 is similar to the inductor component 18 of FIGS. 3A and 3B except that the component 18 of FIG. 5 also includes a heat sink 80 attached to the upper surface 56 of the package 50 with, e.g., a thermally conductive adhesive. Furthermore, any space 82 between the lower surface 58 of the package 50 and the transistor components 42 and 44 and the circuit board 46 may be filled with a thermally conductive material such that the heat sink 80 is operable not only to dissipate heat generated by the inductors $L_1$-$L_n$ (not shown in FIG. 5), but is also operable to dissipate heat generated by the transistor components and any other components (not shown in FIG. 5) over which the inductor component 18 is disposed. The heat sink 80 may be made from metal or from any other heat-conductive material.

Alternate embodiments of the power-supply portion 40 and the inductor component 18 of FIG. 5 are contemplated. For example, the heat sink 80 may have a different shape or pattern than disclosed in conjunction with FIG. 5. Furthermore, the heat sink 80 may be attached to the package 50 in any conventional manner other than with an adhesive, and may be attached to the sides of the package in addition to or instead of to the upper surface 56. Moreover, a thermoelectric cooler (i.e., a Peltier device) may be disposed between the heat sink 80 and the package 50 (hot side of the thermoelectric cooler toward the heat sink, cool side toward the package) such that that combination of the heat sink and cooler may dissipate more heat from the inductor component 18 than the heat sink alone. In addition, the heat sink 80 may be attached to the upper surface 56 of the package 70 of FIG. 4 to form another embodiment of the inductor component 18. Furthermore, the alternate embodiments discussed above in conjunction with FIGS. 3A, 3B, and 4 for the power-supply portion 40 and the inductor component 18 are also contemplated for the power-supply portion 40 and the inductor component 18 of FIG. 5.

Figure 6:
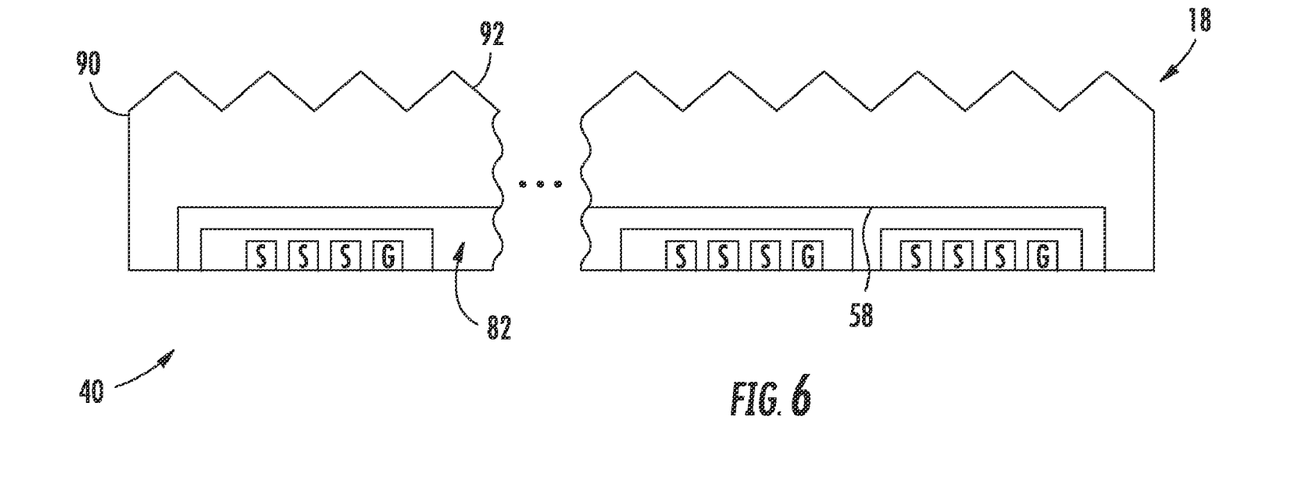

FIG. 6 is a side view of another embodiment of the power-supply portion 40 of FIG. 3A including another embodiment of the inductor component 18. The inductor component 18 of FIG. 6 is similar to the inductor component 18 of FIGS. 3A and 3B except that the inductor component of FIG. 6 includes a package 90 having an upper surface 92 that is patterned to have an increased area (as compared to the area of the lower surface 58) for the increased dissipation of heat. That is, the package 90 acts as a heat sink. Furthermore, any space 82 between the lower surface 58 of the package 90 and the transistor components 42 and 44 and the circuit board 46 may be filled with a thermally conductive material such that the package 90 is operable not only to dissipate heat generated by the inductors $L_1$-$L_n$ (not shown in FIG. 6), but is also operable to dissipate heat generated by the transistor components. The package 90 may be made from plastic or from any other suitable heat-conductive material.

Alternate embodiments of the power-supply portion 40 and the inductor component 18 of FIG. 6 are contemplated. For example, the upper surface 92 of the package 90 may have a different pattern or shape than that disclosed in conjunction with FIG. 6. Furthermore, the sides of the package 90 may also be patterned to increase their surface areas. Moreover, the upper surface 56 of the package 70 of FIG. 4 may be patterned to increase the area of the surface 56 and improve the heat dissipation rate of the package, and to thus form another embodiment of the inductor component 18. In addition, the alternate embodiments discussed above in conjunction with FIGS. 3A, 3B, 4, and 5 for the power-supply portion 40 and for the inductor component 18 are also contemplated for the power-supply portion 40 and the inductor component 18 of FIG. 6.

Figure 7:
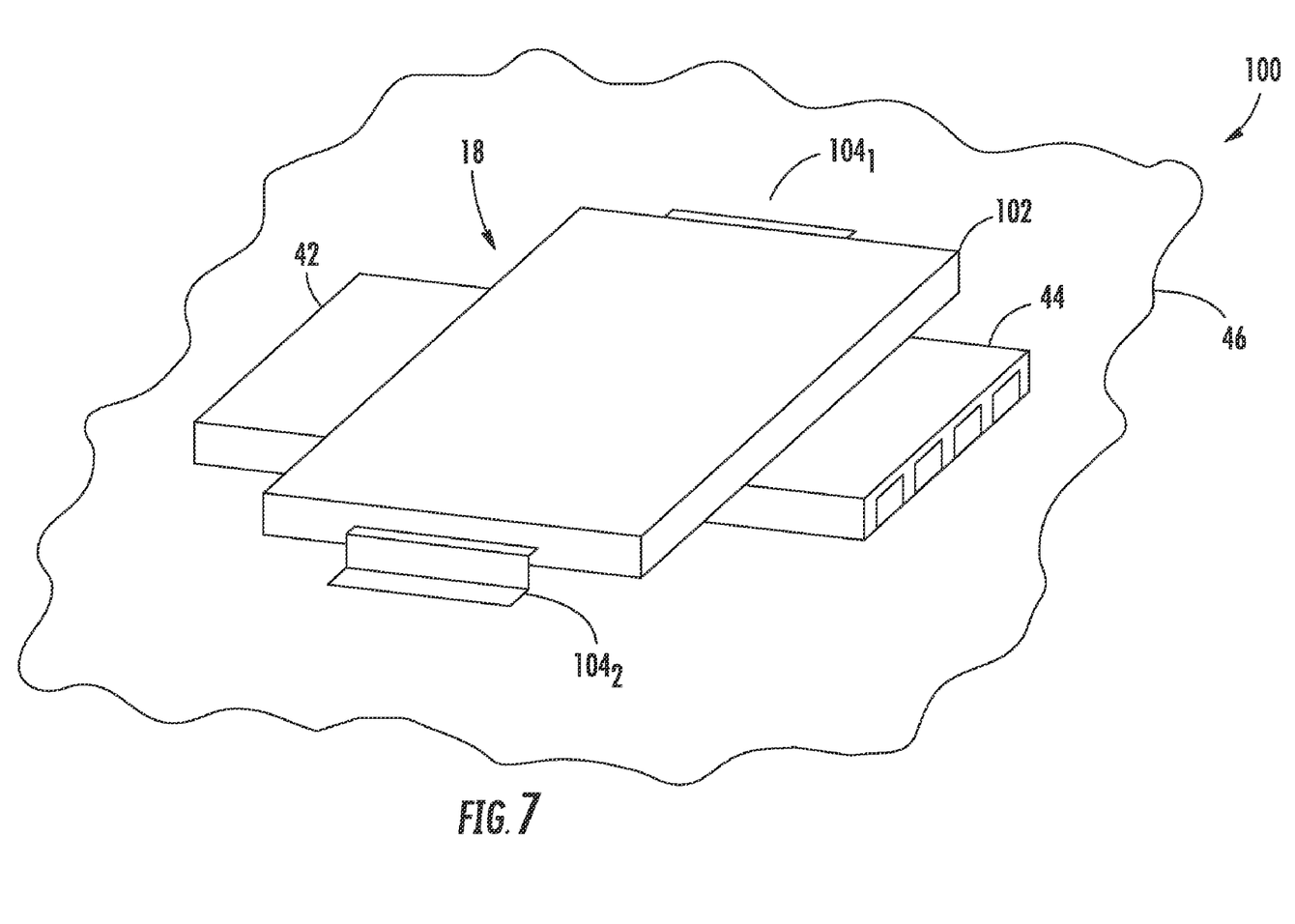
FIG. 7 is a perspective view of a portion of another embodiment of a power supply according to the schematic diagram of FIG. 1.

FIG. 7 is a perspective view of a portion 100 of an embodiment of the power supply 10 of FIG. 1, in which another embodiment of the inductor component 18 spans only a single pair of transistor components 42 and 44. For brevity, only the transistor components 42 and 44 and inductor component 18 of a single power-supply phase are shown, it being understood that for the power supply 10 having multiple phases, the layouts of the other inductor components relative to the other high-side/low-side transistor-component pairs may be similar.

The inductor component 18 includes a package 102 having upper and lower surfaces 56 and 58, and standoffs $104_1$ and $104_2$, which are similar to the standoffs $72_1$ and $72_2$ of FIG. 4. In one embodiment, the standoff $104_1$ also forms an output lead that is coupled between an output node of the inductor L (not shown in FIG. 7) within the package 102 and $V_{out}$ (or the filter inductor 26 if present), and the standoff $104_2$ also forms an input lead that is coupled between an input node of the inductor L and the source of the transistor $14_1$ (not shown in FIG. 7) in the transistor component 42 and the drain of the transistor $16_1$ (not shown in FIG. 7) in the transistor component 44. The conductive traces on the circuit board 46 to which the standoffs/leads $104_1$ and $104_2$ are respectively soldered are omitted from FIG. 7 for clarity.

Alternate embodiments of the power-supply portion 100 and the inductor component 18 of FIG. 7 are contemplated. For example, the standoffs $104_1$ and $104_2$ may be replaced with standoffs similar to the standoffs $60_1$ and $60_2$ of FIG. 3A, and the inductor leads may extend from the standoffs or from other portion of the package 102. In addition, the alternate embodiments discussed above in conjunction with FIGS. 3A, 3B, 4, 5, and 6 for the power-supply portion 40 and for the inductor component 18 are also contemplated for the power-supply component 100 and the inductor component 18 of FIG. 7.

Figure 8:
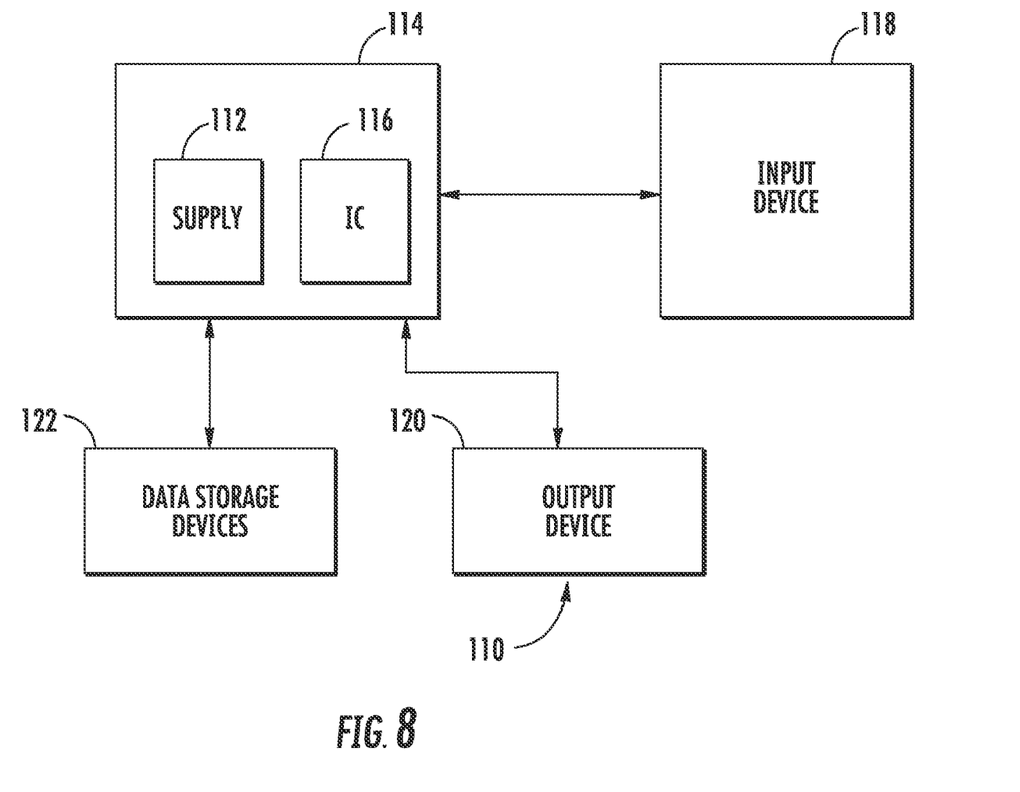
FIG. 8 is a block diagram of an embodiment of a computer system having one or more power supplies that include one or more of the power-supply portions of FIGS. 3-6.

FIG. 8 is a block diagram of a system 110 (here a computer system), which may incorporate a single-phase or multiphase power supply 112 (such as the power supply 10 of FIG. 1) that includes one or more of the embodiments of the power-supply portion 40 or of the inductor component 18 of FIGS. 3A-7.

The system 110 includes computer circuitry 114 for performing computer functions, such as executing software to perform desired calculations and tasks. The circuitry 114 typically includes a controller, processor, or one or more other integrated circuits (ICs) 116, and the power supply 112, which provides power to the IC(s) 116. One or more input devices 118, such as a keyboard or a mouse, are coupled to the computer circuitry 114 and allow an operator (not shown) to manually input data thereto. One or more output devices 120 are coupled to the computer circuitry 114 to provide to the operator data generated by the computer circuitry. Examples of such output devices 120 include a printer and a video display unit. One or more data-storage devices 122 are coupled to the computer circuitry 114 to store data on or retrieve data from external storage media (not shown). Examples of the storage devices 122 and the corresponding storage media include drives that accept hard and floppy disks, tape cassettes, compact disk read-only memories (CD-ROMs), and digital-versatile disks (DVDs).

From the foregoing it will be appreciated that, although specific embodiments have been described herein for purposes of illustration, various modifications may be made without deviating from the spirit and scope of the description. Furthermore, where an alternative is disclosed for a particular embodiment, this alternative may also apply to other embodiments even if not specifically stated.

What is claimed is:

1. A component, comprising:
   a package including a circuit element disposed within the package and the package further including a first surface and a first standoff protruding from the first surface, the package being configured to be positioned over external electronic components and operable to dissipate heat from the circuit element and from the external electronic components;
   wherein the package further includes a second surface disposed opposite to the first surface and a heat sink protruding from the second surface, the heat sink integral with the package; and
   wherein the first surface has a first area and the second surface has a second area that is greater than the first area.

2. The component of claim 1 wherein:
   the first surface has a perimeter; and
   the first standoff protrudes from the surface near the perimeter.

3. The component of claim 1 wherein the first standoff is integral with the package.

4. The component of claim 1 wherein:
   the first standoff comprises a conductive lead; and
   the circuit element comprises a node coupled to the conductive lead.

5. The component of claim 1 wherein the package includes a second standoff protruding from the first surface and spaced from the first standoff.

6. The component of claim 1 wherein the circuit element comprises an inductor.

7. The component of claim 1, further comprising:
   wherein the circuit element comprises a first inductor; and
   a second inductor disposed within the package and magnetically uncoupled from the first inductor.

8. The component of claim 1, further comprising:
   wherein the circuit element comprises a first inductor; and
   a second inductor disposed within the package and magnetically coupled to the first inductor.

9. The component of claim 1,
   wherein the external electronic components are positioned in contact with the first surface.

10. The component of claim 9, wherein the second surface of the package is patterned to increase the second area relative to the first area of the first surface when the first surface is planar.

11. The component of claim 1,
    wherein there is space between the first surface and the external electronic components; and
    wherein the space is at least partially filled with a thermally conductive material.

12. The component of claim 11, wherein the second area of the package is patterned to increase the second area of the second surface relative to the first area of the first surface.

13. The component of claim 12 wherein the package further includes side surfaces and wherein the side surfaces of the package are patterned to increase the areas of the side surfaces relative to planar side surfaces.

14. The component of claim 11, wherein the thermally conductive material comprises epoxy.

15. A component, comprising:
    a package having an integral circuit element disposed within the package and the package including at least one standoff, the package further including,
    a first surface,
    a second surface opposite the first surface, the second surface including at least one recess adapted to receive at least one external active electronic component, and
    wherein the package is configured with the first surface having an patterned non-planar area that is greater than a planar second area of the second surface to dissipate heat from the circuit element and from each external electronic component.

16. The component of claim 15 wherein each recess has a depth and wherein each external electronic component has a height that is less than the depth.

17. The component of claim 16 further comprising thermally conductive material disposed each recess and each external electronic component disposed within that recess.

18. The component of claim 15 wherein each recess has a depth and wherein each external electronic component has a height that is approximately equal to the depth.

* * * * *

UNITED STATES PATENT AND TRADEMARK OFFICE
CERTIFICATE OF CORRECTION

| | | |
|---|---|---|
| PATENT NO. | : 8,320,136 B2 | Page 1 of 1 |
| APPLICATION NO. | : 12/202985 | |
| DATED | : November 27, 2012 | |
| INVENTOR(S) | : Kun Xing | |

It is certified that error appears in the above-identified patent and that said Letters Patent is hereby corrected as shown below:

In the Claims

Column 8, line 32, the phrase "wherein the second area of the package is patterned" should read --wherein the second surface of the package is patterned--

Column 8, line 51, the phrase "having an patterned non-planar area" should read --having a patterned non-planar area--

Column 8, line 59, the phrase "material disposed each recess and each external" should read --material disposed in each recess and each external--

Signed and Sealed this
Sixth Day of January, 2015

Michelle K. Lee
*Deputy Director of the United States Patent and Trademark Office*